(12) United States Patent
Ho et al.

(10) Patent No.: US 6,174,747 B1
(45) Date of Patent: Jan. 16, 2001

(54) METHOD OF FABRICATING RIDGE WAVEGUIDE SEMICONDUCTOR LIGHT-EMITTING DEVICE

(75) Inventors: Jin-Kuo Ho; Chienchia Chiu, both of Taipei; Chenn-Shiung Cheng, Hsinchu; Tse-Jun Chen, Taipei, all of (TW)

(73) Assignee: Industrial Technology Research Institute, Hsinchu (TW)

( * ) Notice: Under 35 U.S.C. 154(b), the term of this patent shall be extended for 0 days.

(21) Appl. No.: 09/281,009

(22) Filed: Mar. 30, 1999

(30) Foreign Application Priority Data

Dec. 23, 1998 (TW) .............................................. 087121567

(51) Int. Cl.⁷ .................................................... H01L 21/00
(52) U.S. Cl. ................. 438/31; 438/39; 438/46; 257/94
(58) Field of Search ............... 257/99, 94, 103; 438/31, 39, 46, 47

(56) References Cited

U.S. PATENT DOCUMENTS 5,556,804 * 9/1996 Nagai ..................................... 437/129

5,898,190 * 9/1996 Iwata ...................................... 257/99

* cited by examiner

Primary Examiner—Olik Chaudhuri
Assistant Examiner—Douglas A. Wille
(74) Attorney, Agent, or Firm—Beyer Weaver & Thomas, LLP (57) ABSTRACT

A method of fabricating a ridge waveguide semiconductor light-emitting device is provided in which an oxide semiconductor having a heavy carrier concentration serves as the interface of the metal layer and the epitaxial layer to make the current flow through the ridge waveguide. This invention forms an oxide semiconductor having a heavy carrier concentration thereon after finishing the basic structure of a ridge waveguide semiconductor light-emitting device, then forms a metal layer to conduct current. Since the carrier concentration at the surface of the ridge waveguide is higher than that at the inner portion, the current primarily flows through the interface of the oxide semiconductor having a heavy carrier concentration and the vertex of the ridge waveguide. Thus the current is restricted to only flow through the vertex of the ridge waveguide.

20 Claims, 9 Drawing Sheets

METHOD OF FABRICATING RIDGE WAVEGUIDE SEMICONDUCTOR LIGHT-EMITTING DEVICE

BACKGROUND OF THE INVENTION

1. Field of the Invention

This invention relates to a method of fabricating a ridge waveguide semiconductor light-emitting device in which the carrier concentration at the top surface of the ridge waveguide is higher than that at the lower portion thereof.

2. Description of Prior Arts

Semiconductor light-emitting devices have been widely developed due to the demands of data transmission and storage. Specially, a semiconductor laser can obtain a better performance for use in light transmission or storage partially because of its narrow frequency spectral width. Nowadays, there are various kinds of fabrication methods for semiconductor lasers. Further, a single mode semiconductor laser can prevent astigmatism and reduce the ratio of longitudinal and transversal divergence of the laser beam. Therefore, many conventional methods are provided to restrict the current to flow into the active layer through the vertex of the ridge waveguide only. Thus, the light-emitting region is restricted to the area of active layer under the ridge waveguide, thereby obtaining a single mode semiconductor laser. The conventional methods of restricting the flow of current include a method in which an insulating layer such as $SiO_2$, $Si_3N_4$, etc., is coated on the chip except for the ridge waveguide to restrict the flow of current. U.S. Pat. Nos. 5,550,081 and 5,403,775 disclose the method of oxidizing the aluminum included in the epitaxial-layers to form an insulating layer of $Al_2O_3$ so as to restrict the flow of current. U.S. Pat. No. 5,658,824 discloses a method of coating epoxy resin on the chip except for the ridge waveguide. Furthermore, U.S. Pat. No. 5,351,258 discloses a method of coating $SiO_2$ and epoxy resin to restrict the current. Additionally, U.S. Pat. No. 5,304,507 discloses a method to re-grow a semiconductor epitaxial layer of another conductivity type or an insulating on the chip except for the ridge waveguide by an epitaxial method so as to restrict the area and position of the active layer through which the current can flow.

Figure 1A:
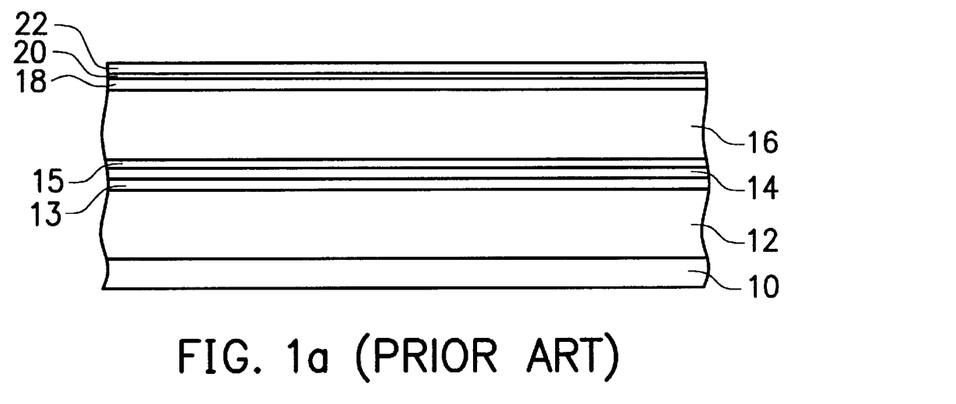
FIGS. 1a to 1m are diagrams illustrating a conventional process of fabricating a self-aligned laser diode.
Figure 1B:
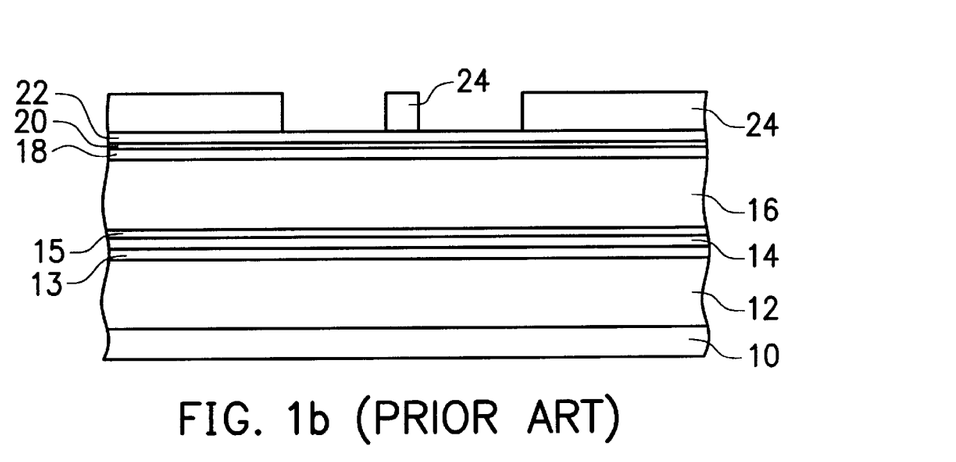
Figure 1C:
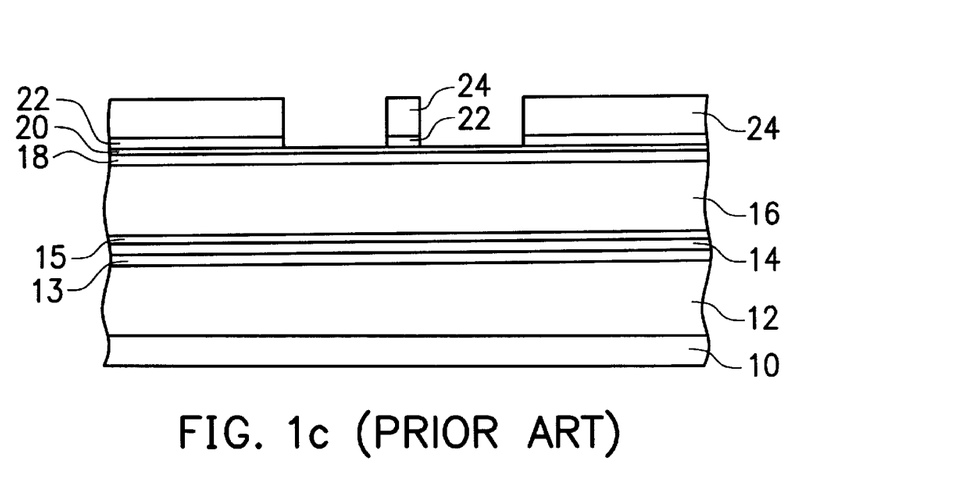
Figure 1D:
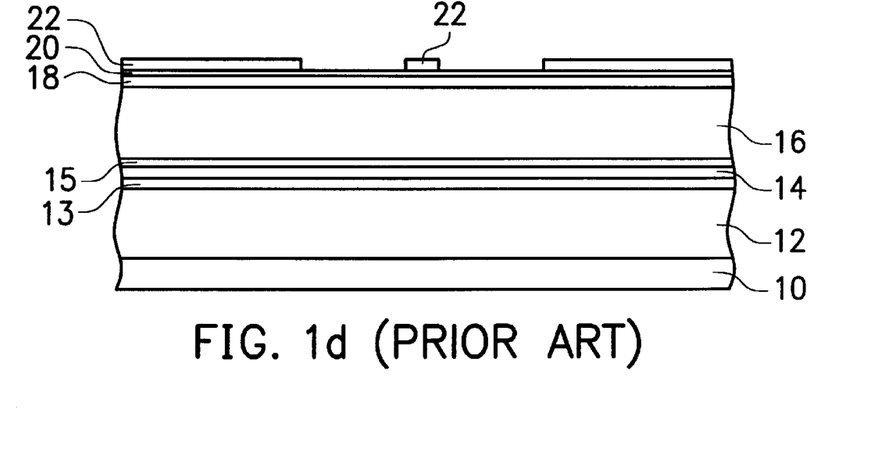
Figure 1E:
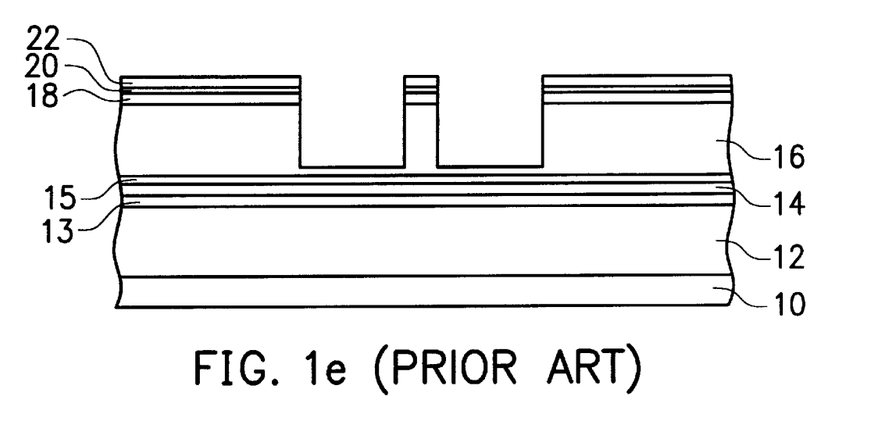
Figure 1F:
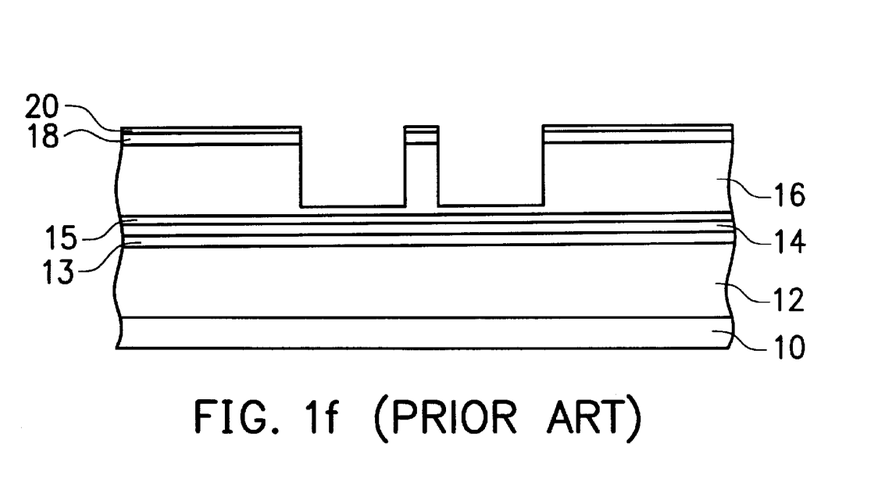
Figure 1G:
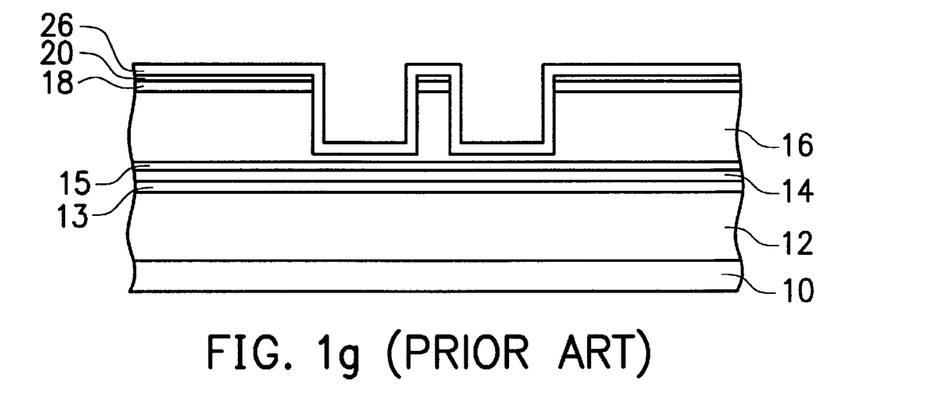
Figure 1H:
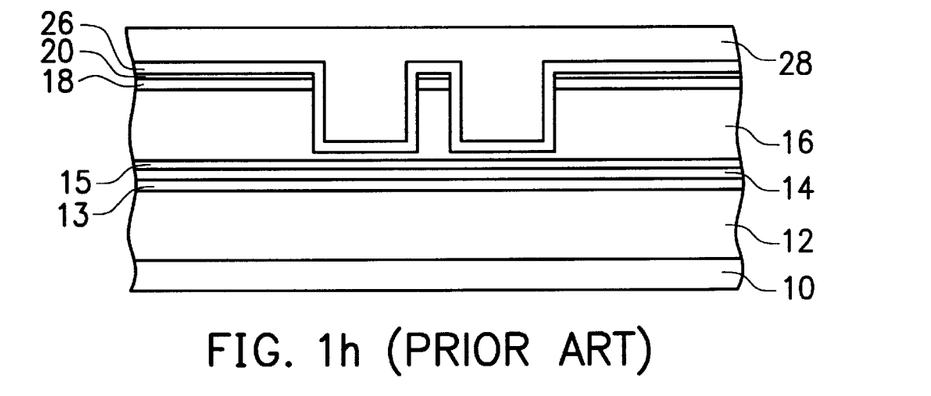
Figure 1I:
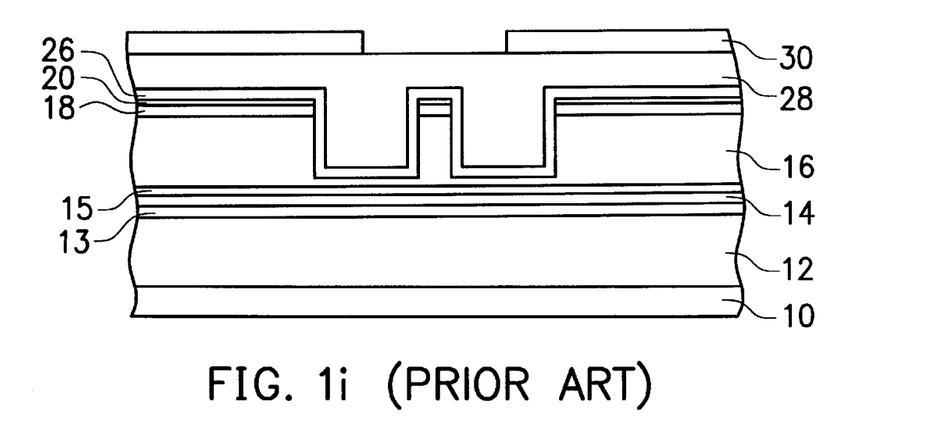
Figure 1J:
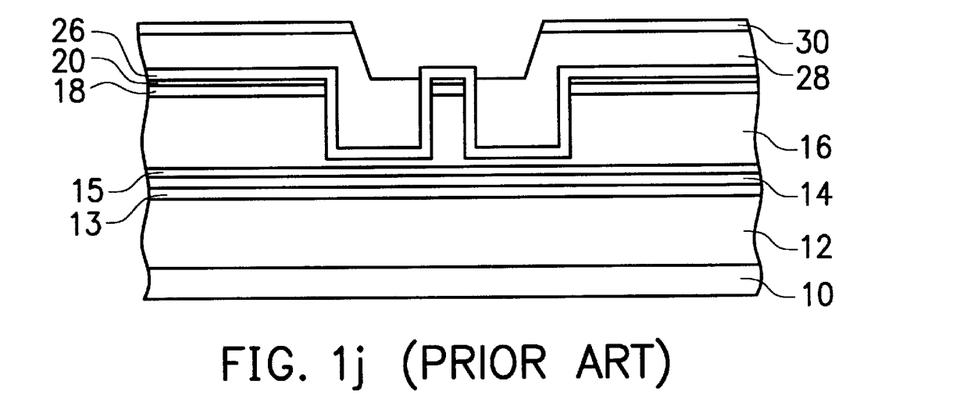
Figure 1K:
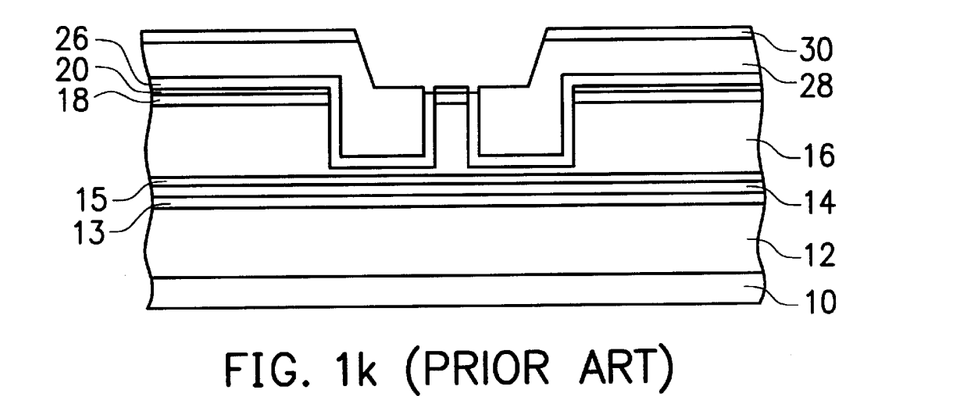
Figure 1L:
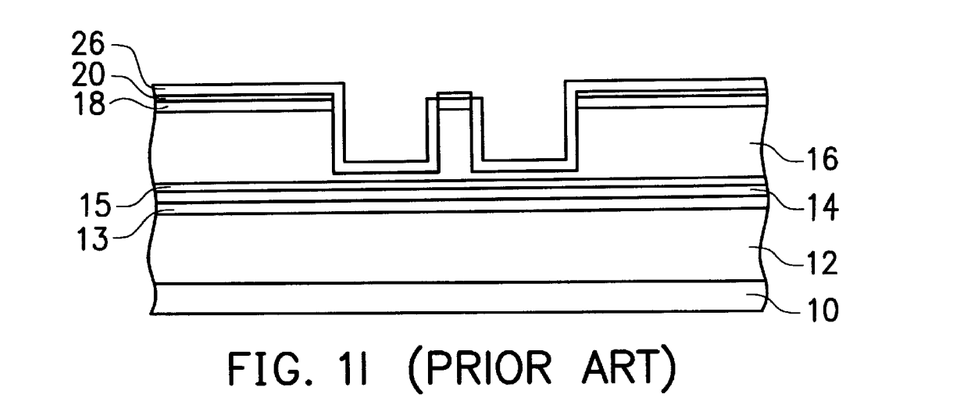
Figure 1M:
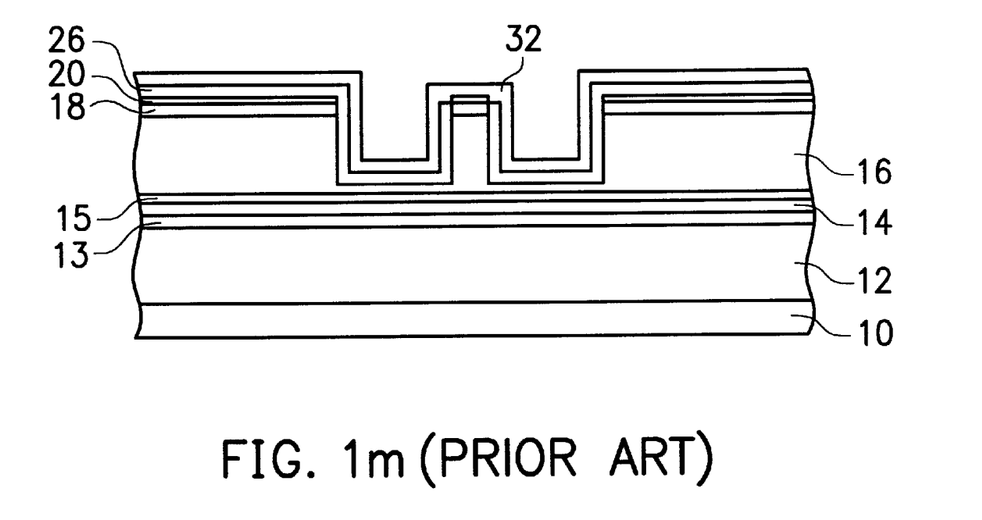

In Taiwanese Patent Application No. 87109771, a self-aligned process for fabricating semiconductor lasers is disclosed, which includes the steps of: (1) referring to FIG. 1a, sequentially forming an n-AlInP layer 12, an undoped AlGaInP layer 13, a quantum-well active layer 14, an undoped AlGaInP layer 15, a p-AlInP layer 16, a p-GaInP layer 18, a p-GaAs layer 20 and a $SiO_2$ layer 22 on the substrate 10; (2) referring to FIG. 1b, forming a photoresist layer 24 thereon and patterning the photoresist layer 24 by a photolithography process; (3) referring to FIG. 1c, etching the $SiO_2$ layer 22 that is not covered by the patterned photoresist layer 24; (4) referring to FIG. 1d, removing the photoresist layer 24; (5) referring to FIG. 1e, etching the above epitaxial layers very close to the AlGaInP layer 15; (6) referring to FIG. 1f, removing the $SiO_2$ layer 22; (7) referring to FIG. 1g, depositing a $Si_3N_4$ layer 26 thereon; (8) referring to FIG. 1h, forming a first photoresist layer 28; (9) referring to FIG. 1i, then forming a second photoresist layer 30, and patterning the second photoresist layer 30; (10) referring to FIG. 1j, etching the first photoresist layer 28 by a dry etching process until the $Si_3N_4$ layer 26 on the ridge waveguide is not covered by the first photoresist layer 28; (11) referring to FIG. 1k, etching the $Si_3N_4$ layer 26 to expose the top surface of ridge waveguide; (12) referring to FIG. 1l, removing the second photoresist layer 30 and the first photoresist layer 28; (13) referring to FIG. 1m, forming a metal layer thereon. In this conventional process, an insulator is formed on the chip except for the ridge waveguide to restrict the flow of current. Such a conventional process is complex since it includes 13 steps, and it normally takes about 2 working days to accomplish.

SUMMARY OF THE INVENTION

Accordingly, to overcome the drawbacks of the above prior arts, the object of this invention is to provide a method of fabricating a ridge waveguide semiconductor light-emitting device, in which an oxide semiconductor having a heavy carrier concentration serves as the interface of the metal layer and the epitaxial layer to make the current flow through the ridge waveguide.

According to this invention, the method of fabricating a ridge waveguide semiconductor light-emitting device is simple and suitable for the fabrication of semiconductor lasers with a ridge width smaller than 3 $\mu$m. The fabrication method of this invention can avoid undertaking the complex steps of self-alignment and significantly reduce the production cost.

To achieve the above object, this invention forms an oxide semiconductor having a heavy carrier concentration thereon after finishing the basic structure of a ridge waveguide semiconductor light-emitting device, then forms a metal layer for interconnection.

BRIEF DESCRIPTION OF THE DRAWINGS

The following detailed description, given byway of example and not intended to limit the invention solely to the embodiments described herein, will best be understood in conjunction with the accompanying drawings in which.

DETAILED DESCRIPTION OF THE PREFERRED EMBODIMENTS

Referring to FIG. 2a to FIG. 2g, the method of fabricating a ridge waveguide semiconductor light-emitting device according to this invention includes the following steps.

Figure 2A:
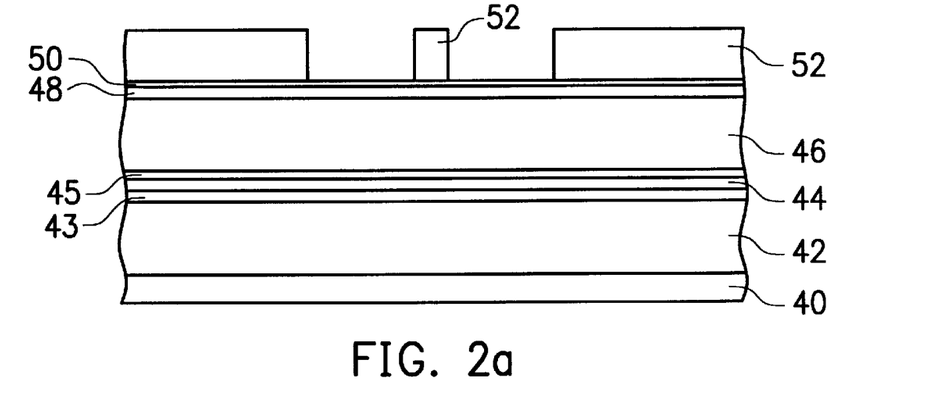
FIGS. 2a to 2g are diagrams illustrating a method of fabricating a ridge waveguide semiconductor light-emitting device according to this invention.

First, an n-AlInP cladding layer 42, an undoped AlGaInP confinement layer 43, a quantum-well active layer 44, an undoped AlGaInP confinement layer 45, a p-AlInP cladding layer 46, a p-GaInP reduced layer 48, and a p-GaAs cap layer 50 are sequentially formed on the n-GaAs substrate 40. The hole concentration of the p-AlInP cladding layer 46, the p-GaInP reduced layer 48, and the p-GaAs cap layer 50 are $7\times10^{17}$ $cm^{-3}$, $2\times10^{18}$ $cm^{-3}$, $2\times10^{19}$ $cm^{-3}$, respectively.

Referring to FIG. 2a, a photoresist layer 52 is formed on the epitaxial layer, and is patterned by photolithography to form a mask for a subsequent etching process.

Figure 2B:
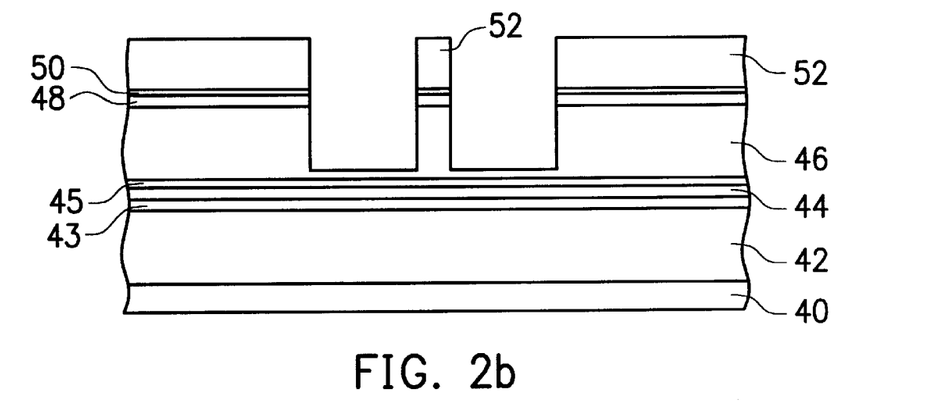

Referring to FIG. 2b, the p-GaAs cap layer 50, the p-GaInP reduced layer 48 and the p-AlInP cladding layer 46 are etched to a position near the AlGaInP confinement layer 45 by dry etching to form a ridge waveguide.

Figure 2C:
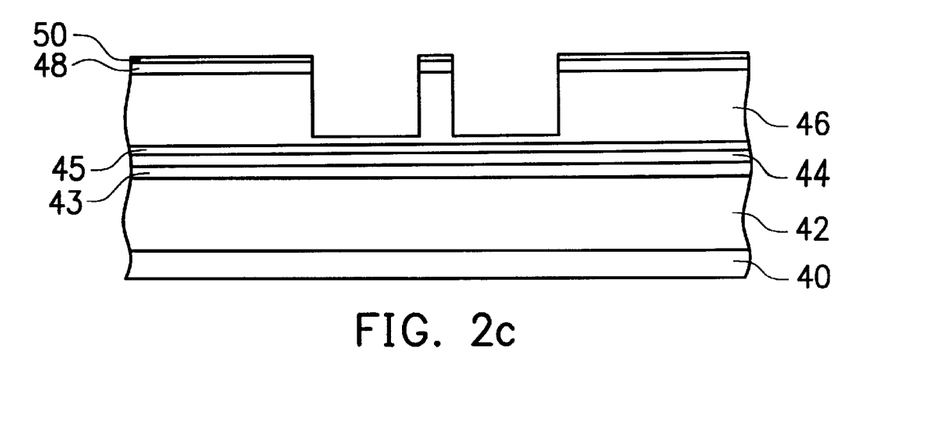

Referring to FIG. 2c, the residual photoresist 52 is removed after etching.

Figure 2D:
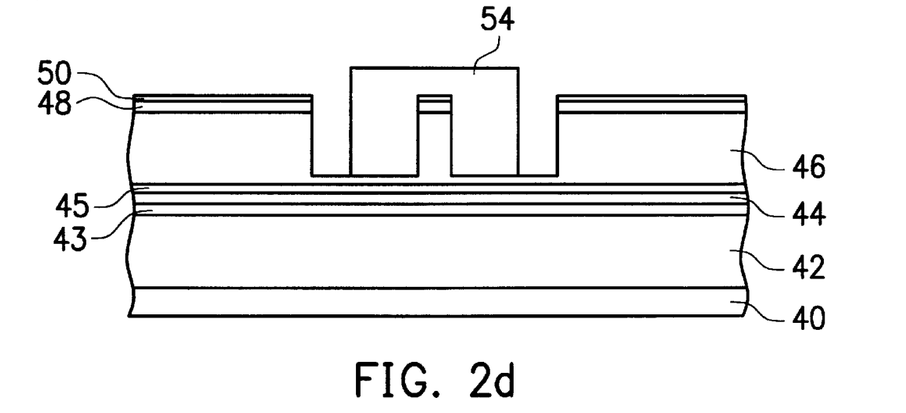

Referring to FIG. 2d, a photoresist layer 54 is formed thereon and is patterned to mask the ridge waveguide.

Figure 2E:
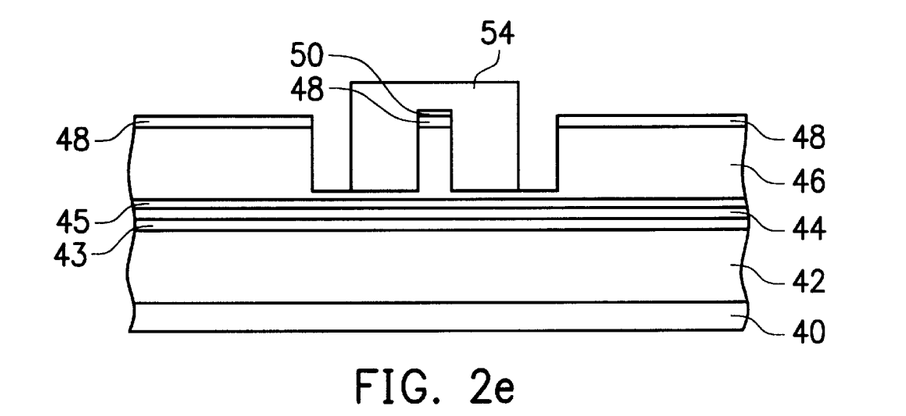

Referring to FIG. 2e, then the p-GaAs cap layer is selectively etched away.

Figure 2F:
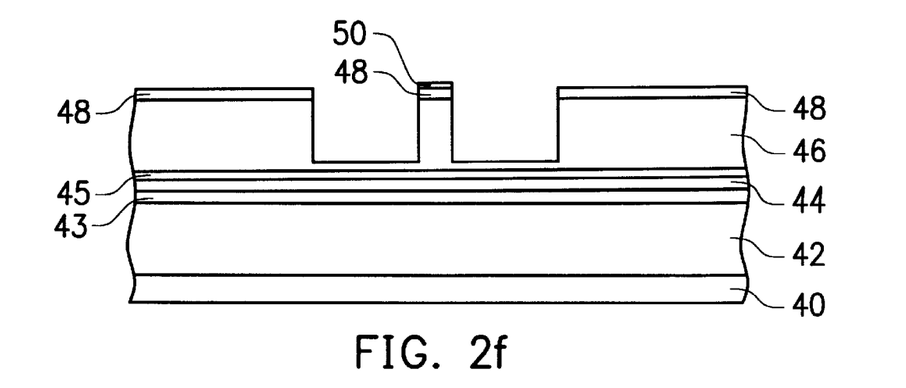

Referring to FIG. 2f, the photoresist layer 54 is removed.

Figure 2G:
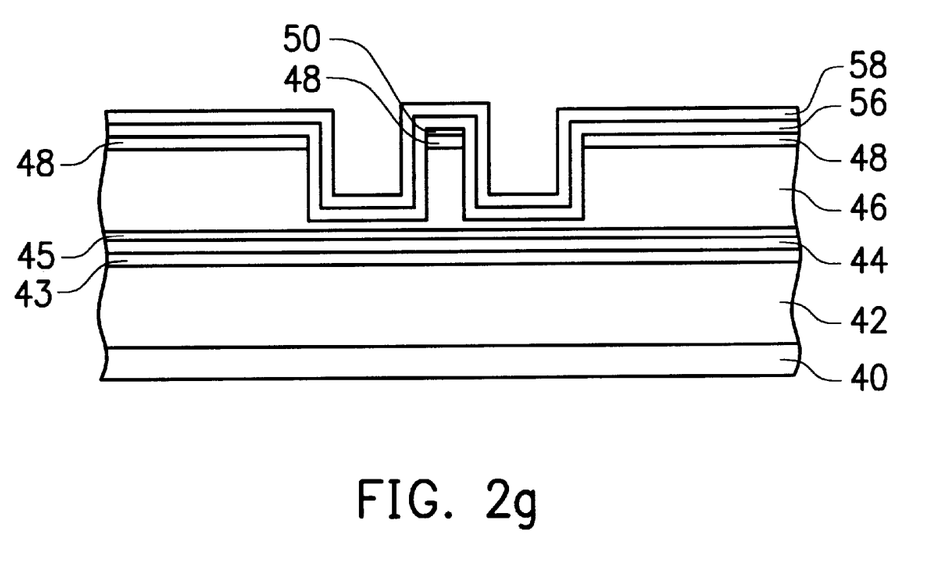

Referring to FIG. 2g, an ITO layer 56 having a thickness of about 1000 Å and a metal layer 58 including Cr and Au are coated thereon. The carrier concentration of the ITO layer is larger than or equal to $10^{19}$ cm$^{-3}$.

Thereafter, a conventional process for fabricating a laser diode is applied. That is, the GaAs substrate is lapped and etched, followed by coating with metal on the backside. Suitable heat treatment is further applied to form a reliable ohmic contact. Then the wafer is cleaved to obtain a plurality of laser diode dies. Then each laser diode is packaged.

The ITO layer 56 can be replaced by other n-type oxide semiconductor, such as (1) $SnO_2$, $In_2O_3$, ZnO, $Tl_2O_3$, CdO, HgO, PbO or $PbO_2$, etc., and a mixture or a solid solution thereof, such as ITO, $In_4Sn_3O_{12}$, $ZnSnO_3$, $SnZn_2O_4$, $Zn_2In_2O_5$, etc.; (2) transition metal oxides, such as MoO, $WO_3$, $V_2O_5$, $Nb_2O_3$, $Nb_2O_5$, $Ta_2O_5$, $HfO_2$, $TiO_2$, etc.; (3) perovskite oxides, such as $BaTiO_3$, $SrTiO_3$, etc.; (4) spinel oxides, such as $NiFe_2O_4$, $ZnGa_2O_4$, $MgIn_2O_4$, $SnZn_2O_4$, or $MIn_2O_4$(M can be Mg, Ca, Sr or Ba), etc.; and (5) $CdSb_2O_6$, $GaInO_3$, $MgInO_4$, $PbCrO_4$, $Zn_2In_2O_5$, $AgInO_2$, $AgSbO_3$, $MgWO_4$, $La_{8-x}Sr_xCu_8O_{20}$, $Sr_xCa_{1-x}RuO_3 (0 \leq x \leq 1)$, etc.

The n-type oxide semiconductor is formed by adjusting the stoichiometry or by doping impurity. For example, $SnO_2$, $In_2O_3$, ZnO are nonstoichiometric. In the case of doping impurity, ZnO is doped with Al, In, Ga, or Ce, $In_2O_3$ is doped with Sn, $BaTiO_3$ is doped with Nb, $AgInO_2$ is doped with Sn, or $CdSb_2O_6$ is doped with Y.

Additionally, the oxide semiconductor must be p-type while the epitaxial layers of the ridge waveguide are n-type. At this time, the oxide semiconductor can be (1) transition metal oxides, such as NiO, CoO, MnO, FeO, $Fe_2O_3$, PdO, $MoO_2$, $Cr_2O_3$, $CrO_2$, $Rh_2O_3$, or a mixture or a solid solution thereof, such as $Ni_{0.5}Co_{0.5}O$, etc.; (2) perovskite oxides such as $LaMnO_3$, $LaCrO_3$, $CaTiO_3$, $Sm_{0.5}Ca_{0.5}CoO_3$, $Sm_{0.5}Sr_{0.5}CoO_3$, $Sm_{0.5}Ba_{0.5}CoO_3$, etc.; (3) spinel oxides such as $Li_xZn_{1-x}V_2O_4 (0 \leq x \leq 1)$, $Mn_{1.5}Co_{0.95}Ni_{0.55}O_4$, etc.; (4) Y124 oxide superconductors such as $Yba_2Cu_4O_8$, etc.; (5) lanthanide-transition metal oxides, such as $LaYO_3$, etc.; and (6) $Cu_2O$, CuO, $Ag_2O$, $Hg_2O$, SnO, $CuAlO_2$, or $SrCu_2O_2$.

Similarly, the p-type oxide semiconductor is formed by adjusting the stoichiometry or by doping impurity. For example, NiO, CoO, MnO, FeO, $YBa_2Cu_4O_8$, $LaMnO_3$, etc., can be nonstoichiometric. In the case of doping impurity, NiO is doped with Li or N, $LaCrO_3$ is doped with Sr or Ca, $SrCu_2O_2$ is doped with K, $CaTiO_3$ is doped with Y or Nb, $LaYO_3$ is doped with alkaline-earth elements, $ZnV_2O_4$ is doped with alkali metals, etc.

In the above embodiment, the oxide semiconductor is a single oxide layer. However, instead of a single oxide layer, the oxide semiconductor can be a plurality of layers of oxide having a same conductivity type (p-type or n-type). Moreover, a nonoxide semiconductor, such as Si, Ge, GaAs, InP, GaP, ZnS, CdTe, PbS or ZnSe etc., having a conductivity type the same as the first oxide layer can be inserted between the oxide semiconductor and the metal layer.

The metal layer can be a single metal layer or a plurality of layers of metal or alloy, such as Cr/Au, 10% Ti—W, Ti/Pt/Au, etc. It is not necessary for the area of the metal layer to be equal to that of the oxide semiconductor while fabricating the light-emitting devices.

In a ridge waveguide laser diode fabricated according to this invention, the current primarily flows from the ITO layer toward the p-GaInP reduced layer and the p-AlInP cladding layer through the p-GaAs cap layer since the hole concentration of the p-GaAs cap layer is about 29 times that of p-AlInP cladding layer and is about 10 times that of p-GaInP reduced layer. The electron concentration of the ITO layer covering the ridge waveguide is larger than $10^{19}$ cm$^{-3}$. In other words, the flow of current is restricted within the region of the ridge waveguide no matter what the width of the ridge waveguide is. Compared with the prior arts, the method of this invention can be more easily applied to fabricate a ridge waveguide semiconductor light-emitting device in which the width of the ridge waveguide is smaller than 3 μm. Moreover, although a semiconductor light-emitting device having a single ridge waveguide is described in the above embodiment, the method of this invention can be used to fabricate a device having a plurality of ridge waveguides.

Figure 3:
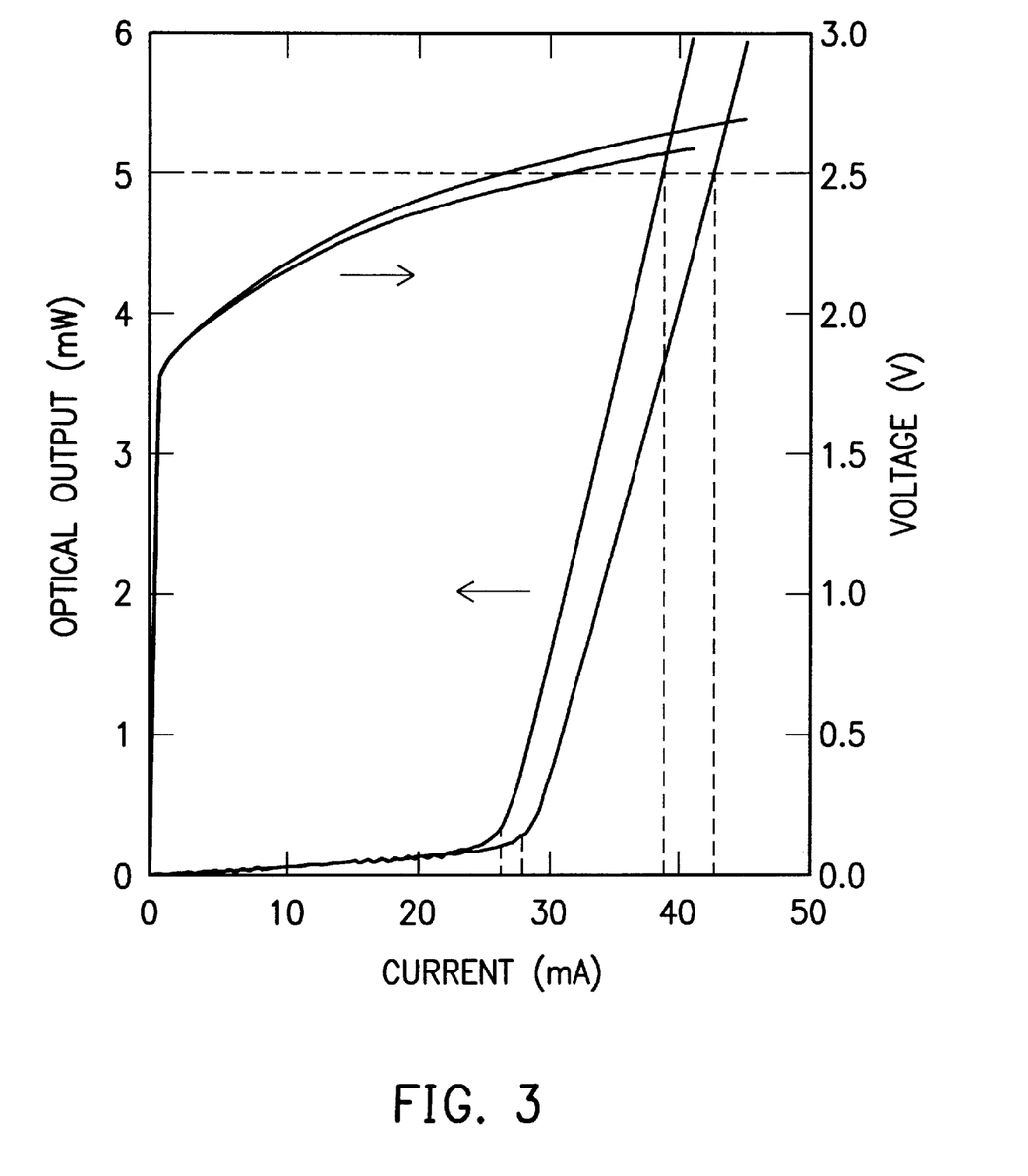
FIG. 3 is a diagram illustrating the I–V curve and the I–L curve for a ridge waveguide semiconductor laser fabricated according to this invention.

Please refer to FIG. 3, which shows the I–V curve and the I–L curve for a laser diode fabricated according to this invention. The threshold current $I_{th}$ is about 26~28 mA, $I_{op}$ is about 39~42 mA, and $V_{op}$ is about 2.57~2.69V when the optical output is 5 mW. This laser diode has similar characteristics and performance to the diode using $SiN_x$ to serve as a current blocking layer in the prior art. But the process of this invention is much easier than the prior arts since the method of this invention includes only 7 steps. Normally, it takes only half a working day to finish the process of this invention. Therefore this invention is suitable for commercial mass production and can reduce the production cost.

In the above embodiment, the ridge waveguide semiconductor light-emitting device is a laser diode. However, this invention is not limited to fabricating a laser diode. The light-emitting device can be a light-emitting diode, etc. Further, the light-emitting device is formed on an n-type substrate in this embodiment. The light-emitting device can be formed on a p-type substrate by those of ordinary skill in the art according to this invention.

An oxide semiconductor having a heavy carrier concentration is used in the above embodiments. However, a semiconductor, such as Si, GaAs, CdTe or PbS, having a heavy carrier concentration can also be applied in practice.

While the present invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A method of fabricating a ridge waveguide semiconductor light-emitting device comprising the steps of:

(i) sequentially forming a first conductivity type cladding layer over a substrate, a first undoped confinement layer over the first conductivity type cladding layer, an active layer over the first undoped confinement layer, a second undoped confinement layer over the active layer, a second conductivity type cladding layer over the second undoped confinement layer, a second conductivity type barrier reduction layer over the second conductivity type cladding layer, and a second conductivity type cap layer over the second conductivity type barrier reduction layer;

(ii) partially etching the second conductivity type cap layer, the second conductivity type barrier reduction layer and the second conductivity type cladding layer to a position near the second confinement layer to form a ridge waveguide;

(iii) forming a photoresist layer to mask the ridge waveguide;

(iv) removing the second conductivity type cap layer which is not covered by the photoresist layer, and then removing the photoresist layer; and (v) forming a metal oxide and a metal layer thereon.

2. A method as claimed in claim 1 wherein the carrier concentration at the surface of the ridge waveguide is higher than that at the inner portion.

3. A method as claimed in claim 1 wherein the first conductivity type is n-type and the second conductivity type is p-type.

4. A method as claimed in claim 1 wherein the first conductivity type is p-type and the second conductivity type is n-type.

5. A method as claimed in claim 3 wherein the semiconductor having a heavy carrier concentration is an oxide semiconductor.

6. A method as claimed in claim 4 wherein the semiconductor having a heavy carrier concentration is an oxide semiconductor.

7. A method as claimed in claims 5 or 6 wherein the oxide semiconductor having a heavy carrier concentration is a single oxide layer.

8. A method as claimed in claims 5 or 6 wherein the oxide semiconductor having a heavy carrier concentration includes a plurality of oxide layers.

9. A method as claimed in claims 5 or 6 wherein the oxide semiconductor having a heavy carrier concentration is a mixed oxide semiconductor.

10. A method as claimed in claims 5 or 6 wherein a nonoxide semiconductor is inserted between the oxide semiconductor having a heavy carrier concentration and the metal, the nonoxide semiconductor having a conductivity type the same as the oxide semiconductor having a heavy carrier concentration.

11. A method as claimed in claim 5 wherein the oxide semiconductor is one of $ZnO$, $SnO_2$, $In_2O_3$, $Tl_2O_3$, $CdO$, $TiO_2$, $PbO$, $PbO_2$ or a mixture or a solid solution thereof.

12. A method as claimed in claim 11 wherein an impurity is doped to the oxide semiconductor to increase the concentration of electrons.

13. A method as claimed in claim 6 wherein the oxide semiconductor is one of $NiO$, $CoO$, $MnO$, $FeO$, $Fe_2O_3$, $CrO$, $Cr_2O_3$, $CrO_2$, $PdO$, $CuO$, $CU_2O$, $SnO$, $Ag_2O$, a mixture or a solid solution thereof, and $CuAlO_2$ and $SrCu_2O_2$.

14. A method as claimed in claim 13 wherein an impurity is doped to the oxide semiconductor to increase the concentration of holes.

15. A method as claimed in claim 5 wherein the oxide semiconductor is indium-tin oxide.

16. A method as claimed in claim 5 wherein the oxide semiconductor is ZnO doped with at least one of Ga, In, Al and Ce.

17. A method as claimed in claim 1 wherein the ridge waveguide semiconductor light-emitting device is a laser diode or a light-emitting diode.

18. A method as claimed in claim 1 wherein at least one ridge waveguide can be formed in step (ii).

19. A method as claimed in claim 1 wherein the metal includes at least one metal layer or alloy layer.

20. A method as claimed in claim 10 wherein the nonoxide semiconductor can be one of Si, Ge, GaAs, InP, GaP, ZnS, CdTe, PbS and ZnSe.

* * * * *